(12) United States Patent
Chen et al.

(10) Patent No.: US 12,119,364 B2
(45) Date of Patent: Oct. 15, 2024

(54) DEEP TRENCH ISOLATION STRUCTURE FOR IMAGE SENSOR

(71) Applicant: MAGVISION SEMICONDUCTOR (BEIJING) INC., Beijing (CN)

(72) Inventors: Gang Chen, San Jose, CA (US); Chin Poh Pang, Pleasanton, CA (US)

(73) Assignee: MAGVISION SEMICONDUCTOR (BEIJING) INC., Beijing (CN)

( * ) Notice: Subject to any disclaimer, the term of this patent is extended or adjusted under 35 U.S.C. 154(b) by 410 days.

(21) Appl. No.: 17/478,556

(22) Filed: Sep. 17, 2021

(65) Prior Publication Data
US 2023/0089511 A1 Mar. 23, 2023

(51) Int. Cl.
*H01L 27/146* (2006.01)

(52) U.S. Cl.
CPC .... *H01L 27/1463* (2013.01); *H01L 27/14636* (2013.01); *H01L 27/1464* (2013.01); *H01L 27/14685* (2013.01); *H01L 27/14689* (2013.01)

(58) Field of Classification Search
CPC ......... H01L 27/14683; H01L 27/14685; H01L 27/14687; H01L 27/14689
See application file for complete search history.

(56) References Cited

U.S. PATENT DOCUMENTS

| 7,214,999 | B2 * | 5/2007 | Holm | H01L 27/14687 257/292 |
| 7,847,361 | B2 * | 12/2010 | Kokusenya | H01L 31/02164 257/E31.127 |
| 9,034,682 | B2 * | 5/2015 | Shim | H01L 27/14685 257/E31.127 |
| 9,711,555 | B2 * | 7/2017 | Liu | H01L 27/14618 |
| 10,043,841 | B1 * | 8/2018 | Chang | H01L 21/31053 |
| 10,304,886 | B2 * | 5/2019 | Chiang | H01L 27/1464 |
| 10,325,949 | B2 * | 6/2019 | Chang | H01L 27/14629 |
| 10,515,992 | B2 * | 12/2019 | Kim | H01L 27/1462 |
| 10,741,603 | B2 * | 8/2020 | Huang | H01L 27/1464 |
| 11,049,932 | B2 * | 6/2021 | Shank | H01L 29/732 |
| 2006/0158547 | A1 * | 7/2006 | Komatsu | H01L 27/14621 348/340 |
| 2006/0186547 | A1 * | 8/2006 | Wang | H01L 27/14623 257/758 |

(Continued)

FOREIGN PATENT DOCUMENTS

| CN | 106206629 A | 12/2016 |
| CN | 107527929 A | 12/2017 |

(Continued)

*Primary Examiner* — Mounir S Amer
*Assistant Examiner* — Alexander Belousov
(74) *Attorney, Agent, or Firm* — HAYNES AND BOONE, LLP

(57) ABSTRACT

An image sensor device is disclosed. The image sensor device includes a substrate having a plurality of pixel regions. Two adjacent pixel regions are optically isolated by an isolation structure. In an embodiment, a method of forming the isolation structure includes receiving a workpiece having a first substrate, etching a frontside of the first substrate to form a first trench, depositing a fill layer in the first trench, removing a portion of the fill layer from the backside of the first substrate to form a second trench surrounded by the fill layer, and depositing a metal layer in the second trench to form the isolation structure.

20 Claims, 18 Drawing Sheets

(56) References Cited

U.S. PATENT DOCUMENTS

| | | | |
|---|---|---|---|
| 2007/0102572 A1* | 5/2007 | Bohdal | B22F 3/225 |
| | | | 244/62 |
| 2007/0102716 A1* | 5/2007 | Kim | H01L 27/14632 |
| | | | 257/89 |
| 2007/0103572 A1* | 5/2007 | Yokozawa | H01L 27/14627 |
| | | | 348/272 |
| 2017/0365631 A1* | 12/2017 | Iizuka | H01L 27/14687 |
| 2019/0035829 A1* | 1/2019 | Chang | H01L 27/14621 |
| 2019/0165026 A1* | 5/2019 | Kuo | H01L 27/1463 |
| 2019/0221601 A1* | 7/2019 | Huang | H01L 31/0352 |
| 2019/0229141 A1* | 7/2019 | Kim | H01L 27/14621 |
| 2020/0203478 A1* | 6/2020 | Shank | H01L 21/76237 |
| 2022/0230909 A1* | 7/2022 | Li | H01L 21/76205 |
| 2023/0089511 A1* | 3/2023 | Chen | H01L 27/14636 |
| | | | 257/432 |
| 2023/0131599 A1* | 4/2023 | Chen | H01L 27/14612 |
| | | | 257/432 |

FOREIGN PATENT DOCUMENTS

| | | |
|---|---|---|
| CN | 108281444 A | 7/2018 |
| CN | 108615739 A | 10/2018 |
| CN | 109037255 A | 12/2018 |
| CN | 112885862 A | 6/2021 |
| CN | 112928058 A | 6/2021 |

\* cited by examiner

DEEP TRENCH ISOLATION STRUCTURE FOR IMAGE SENSOR

BACKGROUND

The applications of image sensors have become ubiquitous. An image sensor may include an array of pixels arranged in two dimensions. Each of the pixels includes a photodiode, or other suitable photoelectric element, and a micro lens (or micro-lens). The micro lens focuses light onto the photodiode, and the photodiode converts the light into electric signals. The electric signals are output from the image sensor to other components of a host electronic device, such as a digital camera, a mobile phone, a computer, a security camera, an automotive product, a medical accessory, or other electronic device, to form an image.

The semiconductor integrated circuit (IC) industry has experienced exponential growth. Technological advances in IC materials and design have produced generations of ICs where each generation has smaller and more complex circuits than the previous generation. The technologies used to manufacture image sensors, such as complementary metal oxide semiconductor (CMOS) image sensor technology, have continued to advance as well. The demands for higher resolution and lower power consumption have driven the trend of further miniaturization and integration of image sensors. The corresponding pixels in image sensors are therefore scaled down. This scaling down process generally provides benefits by increasing production efficiency and lowering associated costs. Such scaling down has also increased the complexity of processing and manufacturing. For example, as the sizes of pixels continue to decrease, optical cross talk and interference among pixels may occur more often. Deep trench isolation (DTI) structures have been proposed to isolate pixels one from another. Although existing DTI structures have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
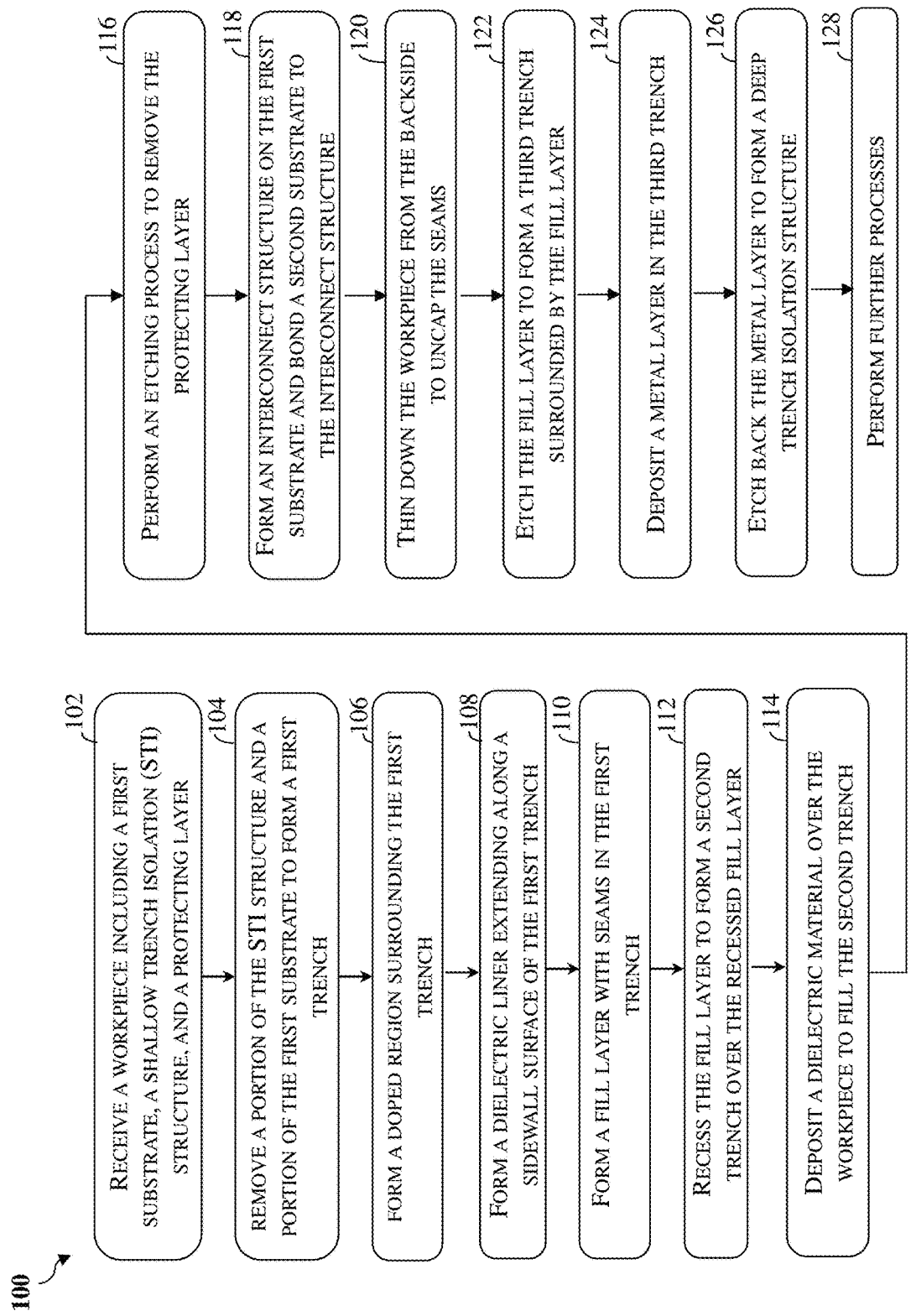
FIG. 1 illustrates a flowchart of an exemplary method for fabricating a semiconductor device having a deep trench isolation (DTI) structure, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−15% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to image sensors. More particularly, some embodiments are related to a complementary metal oxide semiconductor (CMOS) image sensor with a deep trench isolation (DTI) structure defining an array of pixel regions for components of pixels to reside therein. Deep trench isolation (DTI) structures, such as BDTI (back-side DTI) structures and FDTI (front-side DTI or referred to as full-depth DTI) structures, have been picked as a promising approach for isolation among pixels of CMOS image sensors. Generally, a DTI structure defines cells with a unit size. Each cell provides a pixel region for hosting components of a pixel. However, along the aggressive pace of down scaling, optical cross talk between two adjacent pixels becomes more and more severe.

In some embodiments, the disclosed DTI structure is a hybrid structure extending through a substrate, which includes a metal layer surrounded by a cladding layer. The metal layer has a high reflectivity which largely or totally reflects incident light back to the associated pixel region. The metal layer is spaced apart from the substrate by the cladding layer. In some embodiments, the cladding layer includes a semiconductive layer doped for exhibiting certain conductivity such that a bias voltage may be applied to the hybrid DTI structure to induce carrier accumulation and thus reducing dark current. In furtherance of the embodiments, the semiconductive layer is spaced apart from the substrate by a dielectric layer, such as an oxide layer. By forming the hybrid DTI structure, neighboring pixels may be electrically and optically isolated, the quantum efficiency may be increased, and optical cross talk may be reduced.

The various aspects of the present disclosure will now be described in more detail with reference to the figures. In that regard, FIG. 1 is a flowchart illustrating a method 100 of forming a semiconductor device with a front-side deep trench isolation (FDTI) structure according to embodiments of the present disclosure. The method 100 is described below in conjunction with FIGS. 2-17, which are fragmentary cross-sectional views of a workpiece 200 at different stages of fabrication according to embodiments of the method 100. The method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor device or an image sensor upon conclusion of the fabrication processes, the workpiece 200 may be referred to as semiconductor device 200 or image sensor 200 as the context requires. The method 100 may be used to form deep trench isolation structures in stacked silicon CMOS image sensors, non-stack image sensors, and other suitable structures. For avoidance of doubts, the X, Y and Z directions in the figures are perpendicular to one another and are used consistently. Throughout the present disclosure, like reference numerals denote like features unless otherwise excepted.

Figure 2:
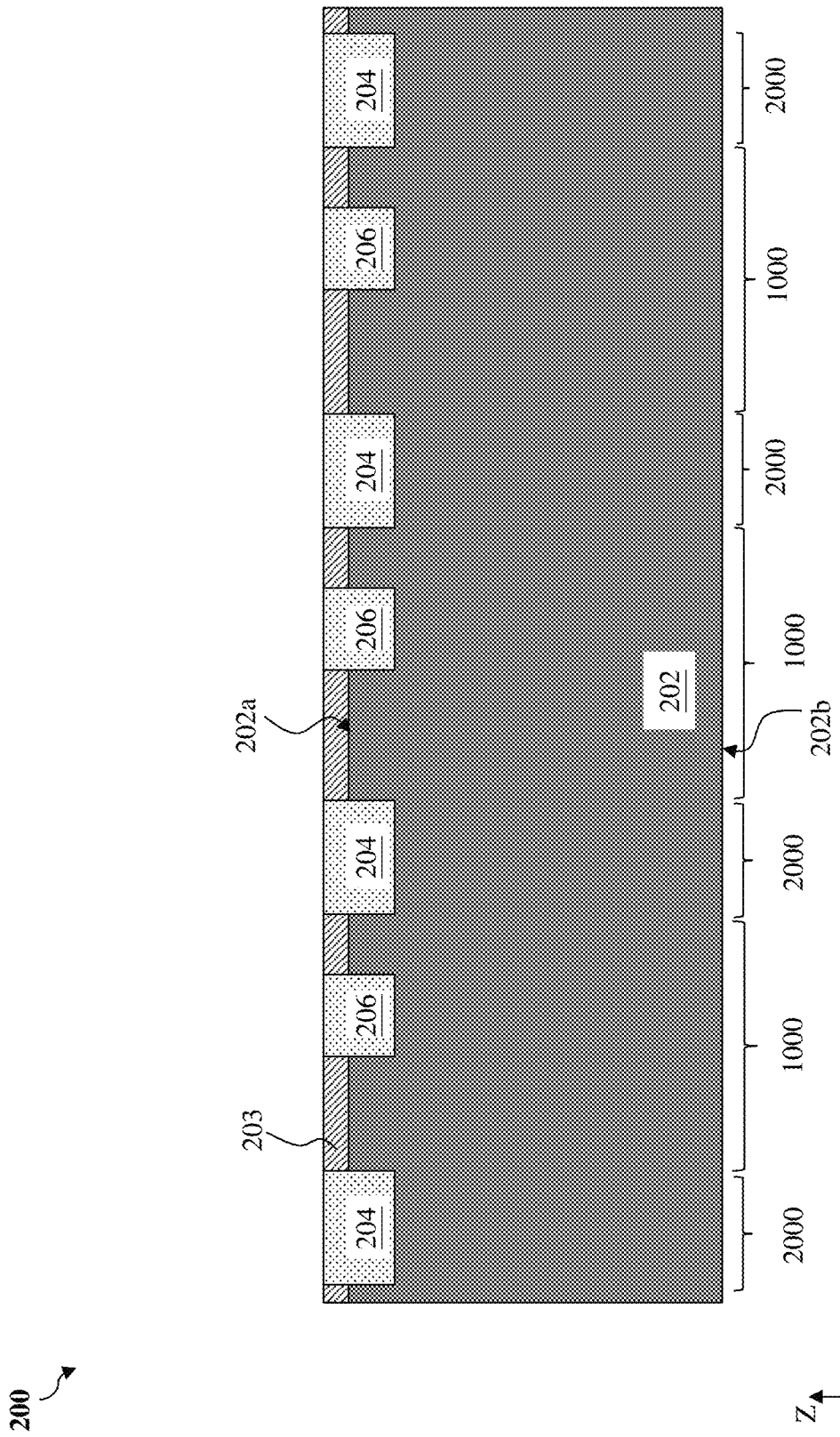
FIGS. 2, 3, 4, 5, 6, 7, 8, 9, 10, 11, 12, 13, 14, 15, 16, 17, and 18 illustrate fragmentary cross-sectional views of a workpiece during a fabrication process according to embodiments of the method in FIG. 1, according to various aspects of the disclosure.
Figure 16:
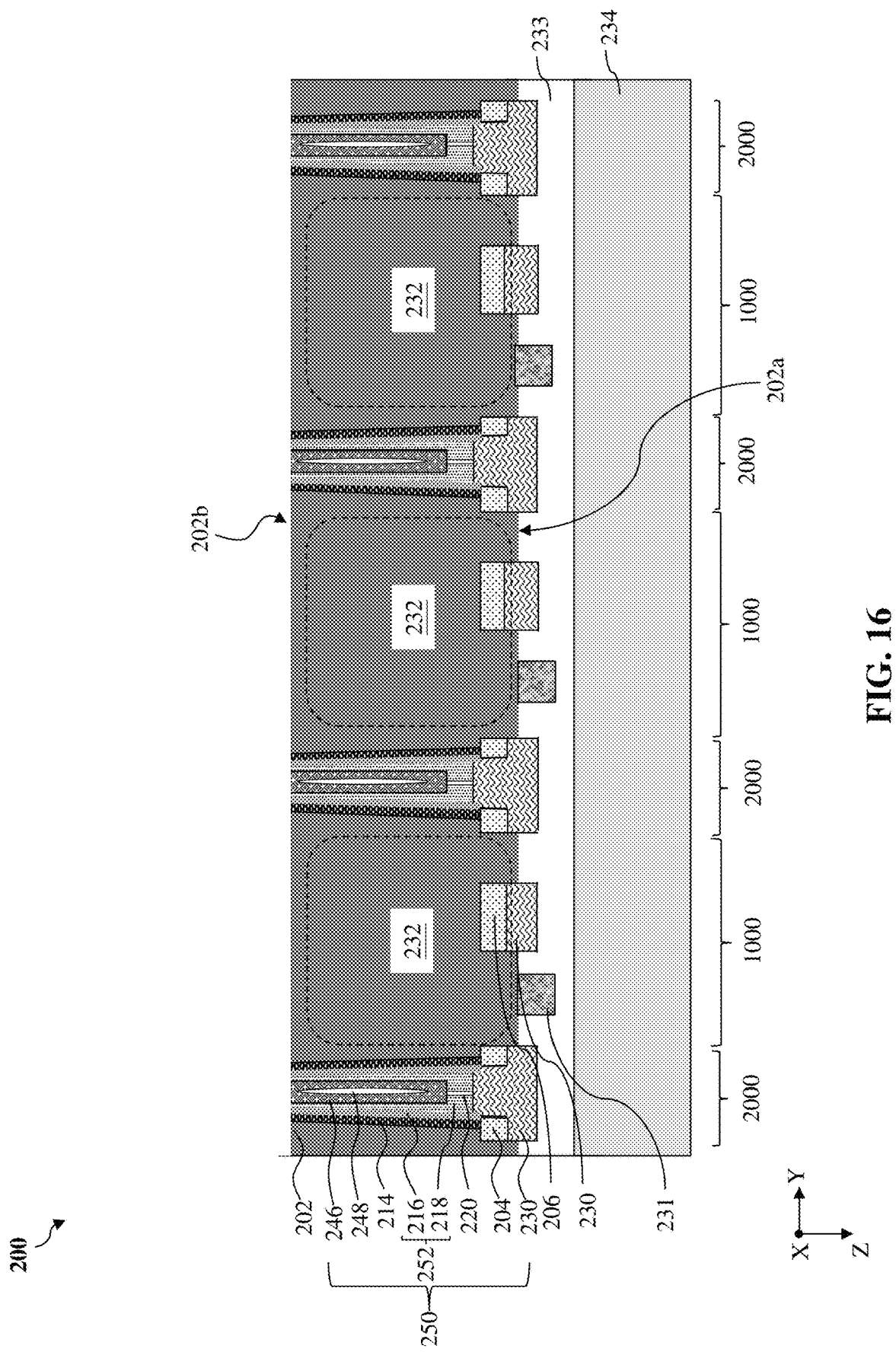

Referring to FIGS. 1 and 2, the method 100 includes a block 102 where a workpiece 200 is received. The workpiece 200 includes a first substrate 202. In an embodiment, the first substrate 202 is a bulk silicon substrate (i.e., including bulk single-crystalline silicon). The first substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the first substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The first substrate 202 includes a first surface 202a and a second surface 202b facing each other. In embodiments represented in FIG. 2, the first surface 202a is the top surface or the front-side surface of the first substrate 202, and the second surface 202b is the bottom surface or the back-side surface of the first substrate 202. The first substrate 202 includes a number of pixel regions 1000 for forming pixels and a numbers of isolation regions 2000 for forming isolation structures. Isolation structures will be formed in the isolation regions 2000 to isolate adjacent pixel regions 1000. The isolation regions 2000 may be formed at the edges of each of the pixel regions 1000, such that each of the pixel regions 1000 may be defined as a closed space surrounded by walls of the to-be-formed isolation structures (e.g., isolation structure 250 as shown in FIG. 16) from a top view.

The workpiece 200 includes a number of first isolation structures 204 formed in the isolation regions 2000. In embodiments represented in FIG. 2, the workpiece 200 also includes one or more second isolation structures 206 formed in each of the pixel regions 1000 to isolate adjacent components (e.g., a photodiode and associated transistors) in the same pixel region 1000. It is noted that, in alternative embodiments where a pixel includes a continuous active region, the workpiece 200 may not include second isolation structures 206 in that pixel region 1000. The first isolation structure 204 and the second isolation structure 206 may also be referred to as a first shallow trench isolation (STI) structure 204 and a second STI structure 206, respectively. In some embodiments, the first STI structures 204 and the second STI structures 206 may include silicon oxide, silicon oxynitride, fluorine-doped silicate glass (FSG), a low-k dielectric material, combinations thereof, and/or other suitable materials. The first STI structures 204 and the second STI structures 206 may be formed simultaneously or sequentially in any order.

In an embodiment, the formation of the first STI structures 204 and the second STI structures 206 includes but not limited to: forming a protecting layer 203 on the first surface 202a of the first substrate 202, and a patterning process to form a number of openings exposing portions of the first substrate 202, removing the portions of the first substrate 202 exposed by the openings to form a number of trenches, forming one or more dielectric layers over the first substrate 202 to fill the trenches, and performing a planarization process (e.g., a chemical mechanical polishing (CMP) process) to remove excess materials on the protecting layer 203 to form the first STI structures 204 and the second STI structures 206. In some embodiments, the planarization process may stop when it reaches the top surface of the protecting layer 203, which is used to protect the first substrate 202 during the planarization process. The patterning process may include multiple processes. For example, a photoresist layer (not shown) may be formed over the protecting layer 203, exposed to a radiation source through a patterned mask, and subsequently developed to form a patterned masking element. The protecting layer 203 and the first substrate 202 may then be etched using the patterned photoresist layer as an etch mask to form the number of openings. The protecting layer 203 may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof.

Figure 3:
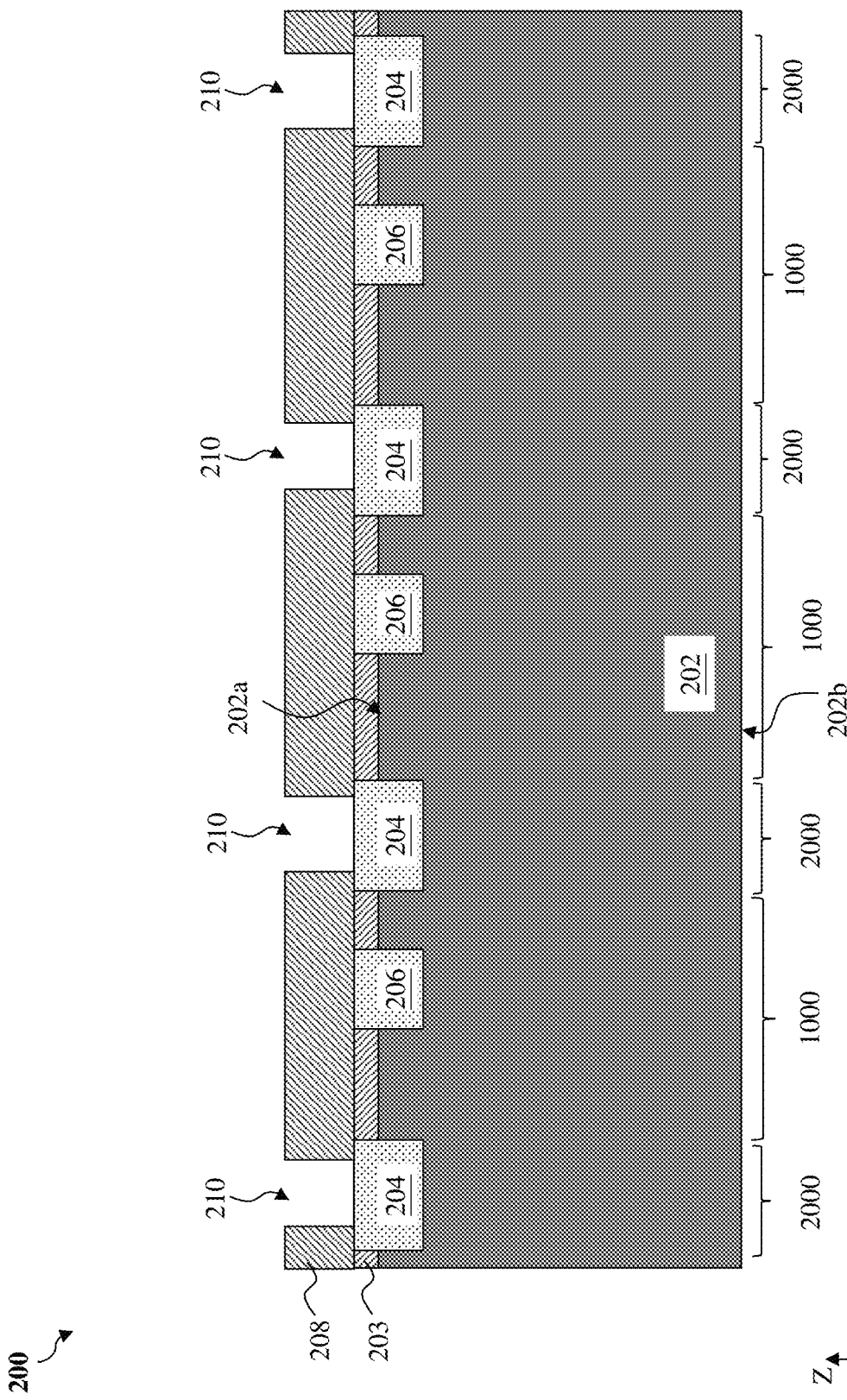
Figure 4:
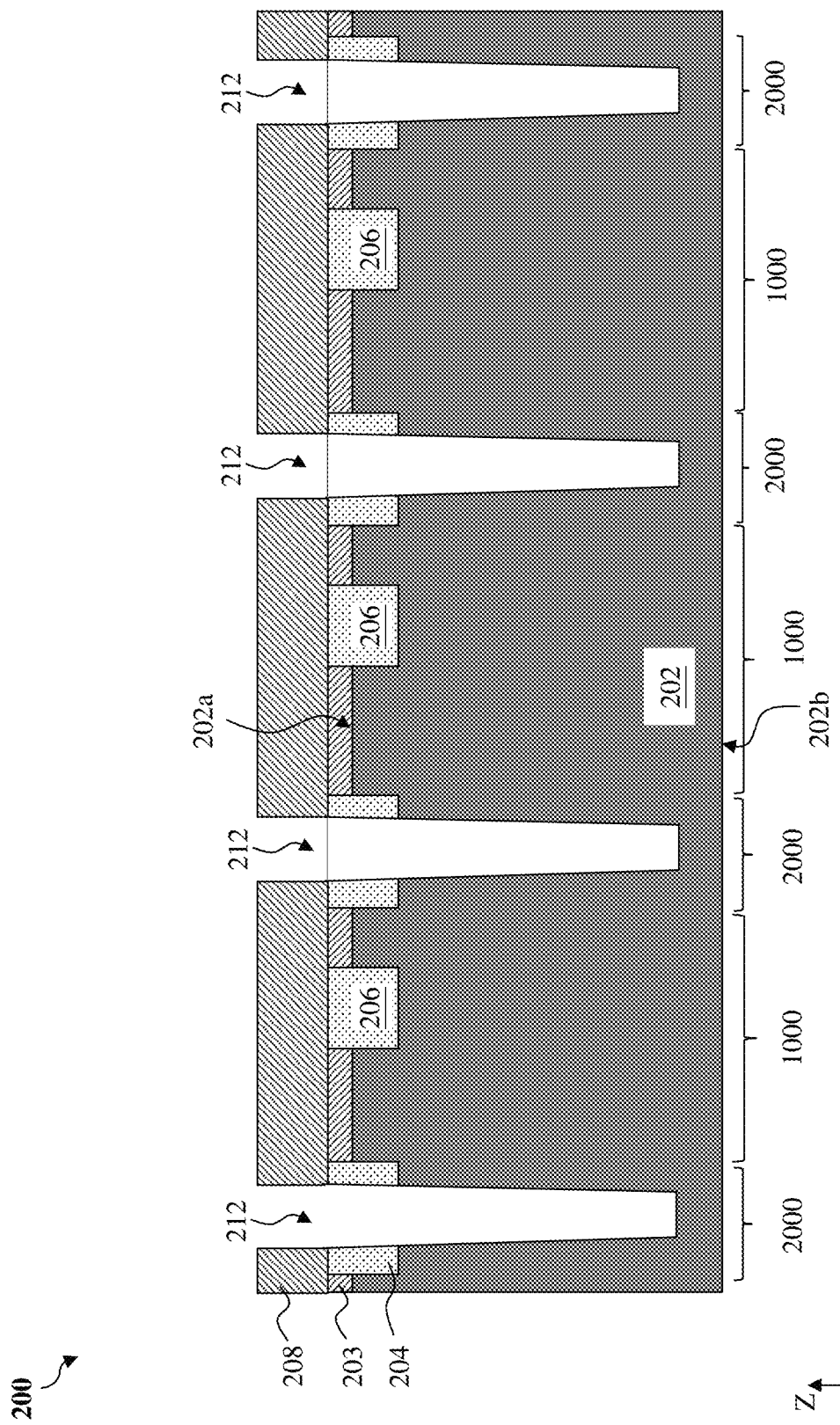
Figure 8:
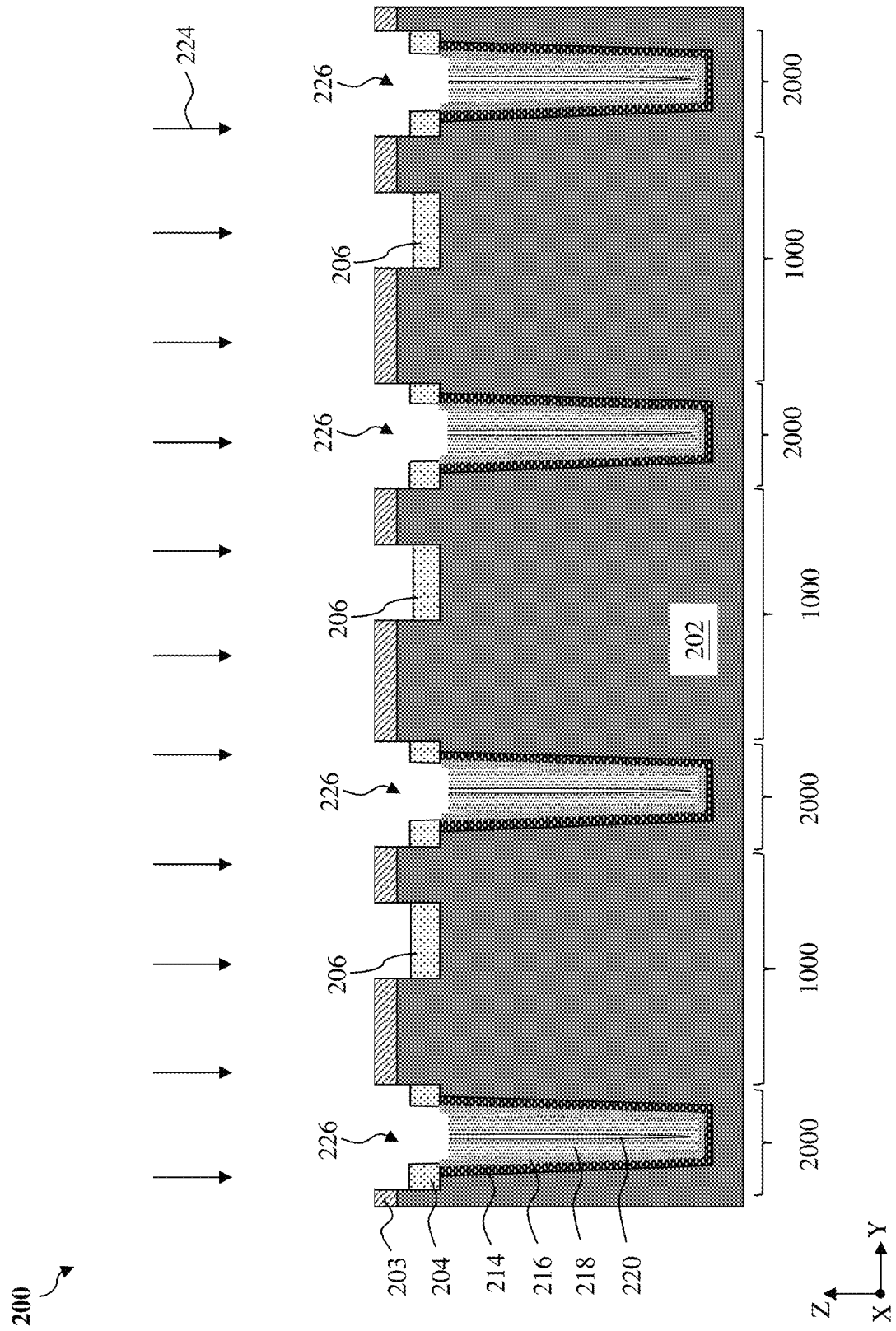

Referring to FIGS. 1 and 3-4, the method 100 includes a block 104 where a portion of the first STI structure 204 and a portion of the first substrate 202 directly under the first STI structure 204 are removed to form a first trench 212. As shown in FIG. 3, the formation of the first trench 212 includes forming a patterned hard mask layer 208 over the workpiece 200. The patterned hard mask layer 208 includes an opening 210 exposing a portion of the first STI structure 204. In embodiments represented in FIG. 3, the opening 210 spans a width smaller than a width of the first STI structure 204 along the Y direction. In some other embodiments, instead of using the patterned hard mask layer 208, other suitable mask films may be used to facilitate the formation of the first trench 212. Now referring to FIG. 4, an etching process is performed to extend the opening 210 vertically downward to form the first trench 212 while using the patterned hard mask layer 208 as an etch mask. More specifically, the etching process removes the portion of the first STI structure 204 exposed by the opening 210 and a portion of the first substrate 202 directly under that portion of the first STI structure 204 to form the first trench 212. In embodiments represented in FIG. 4, the first trench 212 extends through the first STI structure 204 and vertically downward beyond the first surface 202a of the first substrate 202. The first trench 212 may be a tapered trench as shown in FIG. 4 or may be a trench having substantially vertical sidewalls. The etching process may be a dry etching process, a wet etching process, or combinations thereof that implements a suitable etchant. In some other implementations, the first trench 212 may be formed without using the patterned hard mask layer 208. In an embodiment, the patterned hard mask layer 208 is selectively removed after forming the first trench 212. In another embodiment, instead of removing the patterned hard mask layer 208 immediately after forming the first trench 212, the patterned hard mask layer 208 may be removed by a subsequent etching process 224 (FIG. 8).

Figure 5:
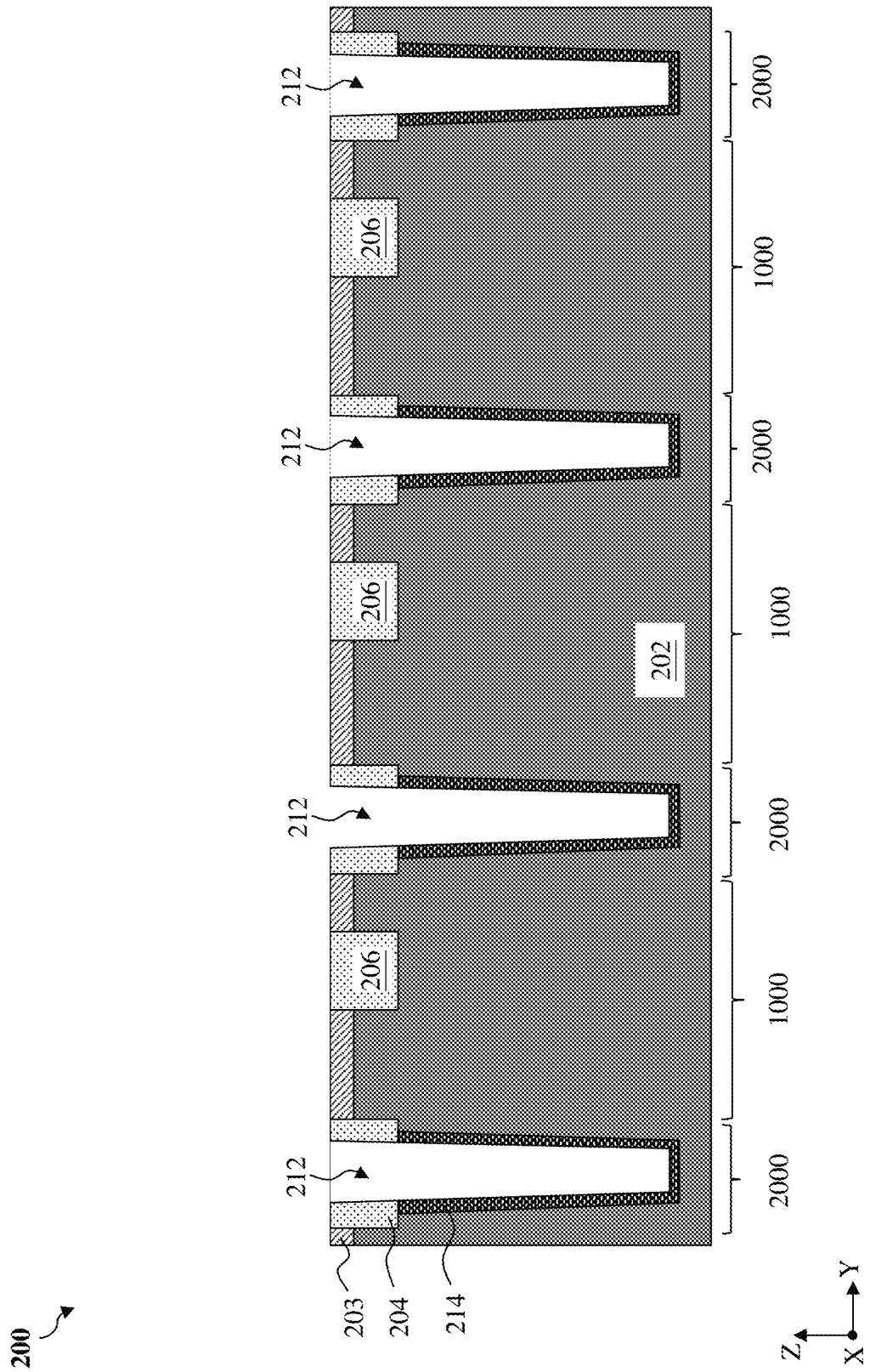

Referring to FIGS. 1 and 5 (FIG. 5 shows the embodiment without using the patterned hard mask layer 208), the method 100 includes a block 106 where a doped region 214 is formed along the sidewall and the bottom surface of the first trench 212. A plasma doping process (e.g., plasma immersion ion implantation) may be performed to form the doped region 214. The ion implantation process implants portions of the first substrate 202 around the sidewalls and bottom surface of the first trench 212 not covered by the first STI structure 204 with an implant species. In some embodiments, the first STI structure 204 also includes the implant species. A doping polarity of the doped region 214 is the same as a doping polarity of the first substrate 202, that is opposite with the photosensitive devices which will be formed in the pixel region 1000, but with a higher dopant concentration than the first substrate 202. In embodiments where the first substrate 202 is a p-type substrate with a first concentration, the doped region 214 is a p-type doped region with a higher dopant concentration such that holes would accumulate at the sidewalls of the first trench 212, thereby isolating the dangling bonds and/or defects at the interface between the first substrate 202 and the first trench 212, reducing dark current and white pixels. The p-type implant species may include boron, for example. In embodiments where the first substrate 202 is an n-type substrate, the doped region 214 is an n-type doped region 214, and the implant species may include phosphorus, for example.

Figure 6:
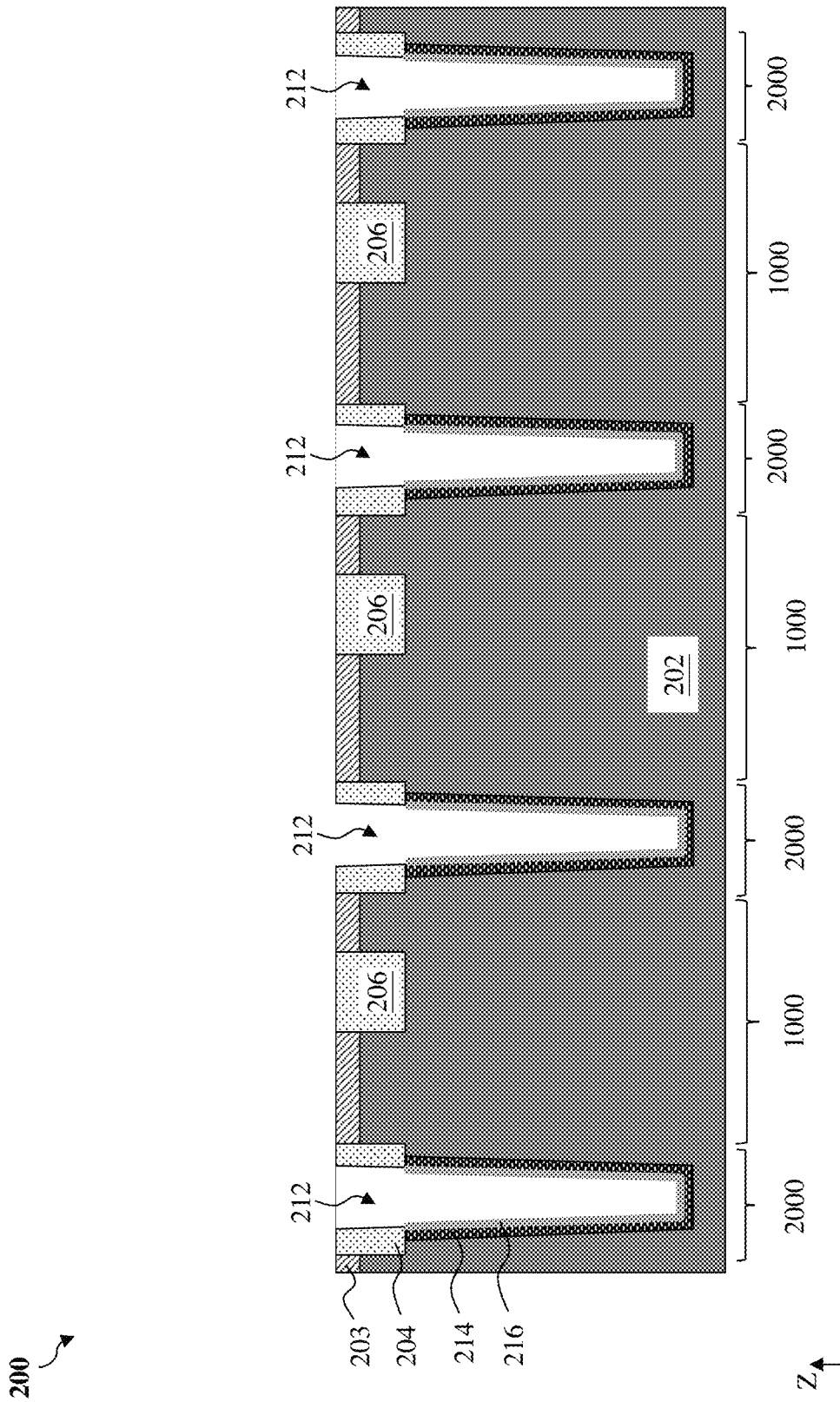

Referring to FIGS. 1 and 6, the method 100 includes a block 108 where a dielectric liner 216 is formed in the first trench 212 to electrically isolate other conductive layers to-be-formed in the first trench 212 from contacting the first substrate 202. In some embodiments, the dielectric liner 216 may include silicon oxide, silicon nitride, silicon oxycarbonitride, silicon carbonitride, silicon oxynitride, other suitable materials, or combinations thereof. The dielectric liner 216 may be formed using a suitable method, such as atomic layer deposition (ALD), chemical vapor deposition (CVD), thermal oxidation, or other suitable method. In embodiments represented in FIG. 6, the dielectric liner 216 is formed by thermal oxidation and is thus only formed on surfaces of the first substrate 202 exposed by the first trench 212. That is, the dielectric liner 216 does not extend along sidewall surfaces of the first STI structure 204 exposed by the first trench 212. In embodiments where the first substrate 202 includes silicon, the dielectric liner 216 includes silicon oxide. The dielectric liner 216 partially fills the first trench 212. In embodiments where the dielectric liner 216 is formed by a deposition process, the dielectric liner 216 may be formed over the workpiece 200, including over the sidewall and bottom surface of the first trench 212, the sidewalls and top surfaces of the first STI structures 204, and the top surfaces of the second STI structures 206 and the protecting layer 203.

Figure 7:
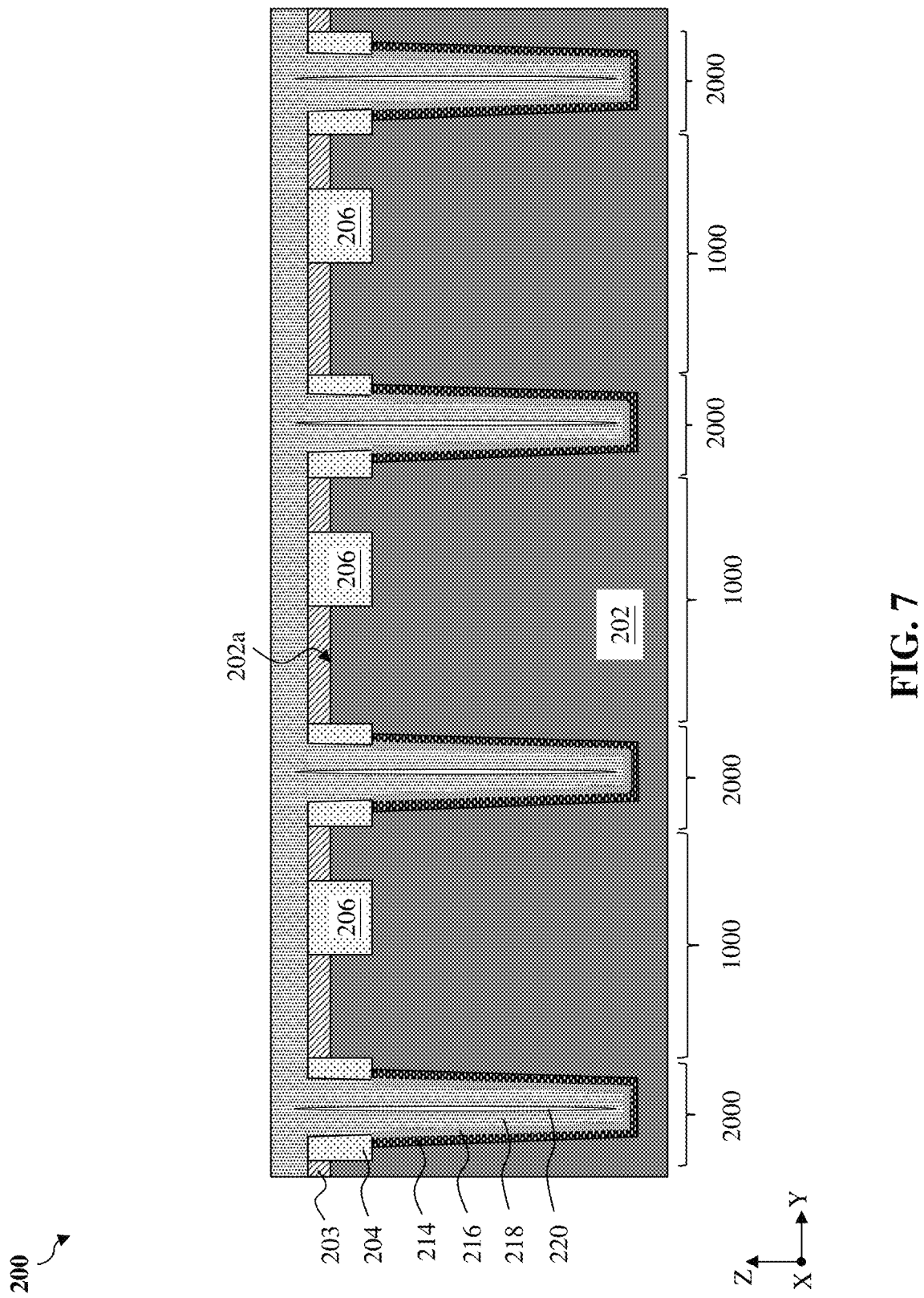

Referring to FIGS. 1 and 7, the method 100 includes a block 110 where a fill layer 218 is formed over the workpiece 200 and fills the first trench 212. In some embodiments, the fill layer 218 is conductive and may be referred to as the conductive fill layer 218. In furtherance of the embodiments, the fill layer 218 includes doped polysilicon (polycrystalline silicon). The fill layer 218 may be deposited using processes such as CVD, ALD, or other suitable process. In one instance, a polysilicon layer is formed using CVD with a silane (SiH$_4$) precursor or other silicon-based precursors at a raised temperature, such as a temperature greater than about 400° C. As the fill layer 218 is deposited on the surfaces of the first trench 212, the width of the first trench 212 becomes smaller, and a seam (air gap) 220 is formed in the deposited material. To further explain, the high aspect ratio of the relatively narrow space in the first trench 212 and a slightly higher deposition rate at the opening of the first trench 212 than inside the first trench 212 cause the deposited material to close off the opening of the first trench 212 before the inside of the first trench 212 is fully filled, resulting in the seam 220 being sealed by the fill layer 218. The seam 220 extends lengthwise along the Z direction. In the illustrated embodiment, a topmost portion of the seam 220 extends above the first surface 202a. Alternatively, a topmost portion of the seam 220 may stay below the first surface 202a. The fill layer 218 is in-situ doped during the deposition. A doping polarity of the fill layer 218 is the same as the doping polarity of the first substrate 202. For instance, when the first substrate 202 is a p-type substrate, the fill layer 218 is also p-type doped but with a higher dopant concentration. In one example, the dopant concentration in the fill layer 218 is also higher than the doped region 214 in the first substrate 202.

Polysilicon in the fill layer 218 may absorb incident light, leading to a reduced quantum efficiency and increased optical cross talk. In embodiments where the pixels and the DTI structure are small to achieve a desired density, a thickness of the polysilicon would be so small that the incident light may penetrate the polysilicon and enter neighboring pixel regions, leading to optical cross talk. To improve the optical performance of the DTI structure while ensuring the electrical performance, a metal layer with high reflectivity is subsequently formed in the first trench 212 to reflect the light back to the corresponding pixel region, as will be explained in further details below.

Referring to FIGS. 1 and 8, the method 100 includes a block 112 where an etching process 224 is performed to etch back the fill layer 218. In an embodiment, the etching process 224 selectively etches the fill layer 218 in an upper portion of the first trench 212 to form a second trench 226 without substantially etching the protecting layer 203 and the dielectric liner 216. The etching process 224 may be a dry etching process, a wet etching process, or combinations thereof that implements a suitable etchant. The depth of the second trench 226 may be controlled by a duration of the etching process 224. In embodiments represented in FIG. 8, a depth of the second trench 226 is larger than a height of the first STI structure 204 such that a bottom surface of the first STI structure 204 is above a top surface of the recessed fill layer 218 and a top portion of the dielectric liner 216 is exposed in the second trench 226. Alternatively, a bottom surface of the first STI structure 204 may be substantially coplanar with a top surface of the recessed fill layer 218. Alternatively, a top surface of the recessed fill layer 218 may remain above a bottom surface of the first STI structure 204 to avoid exposing and potentially damaging the dielectric liner 216. In embodiments where there is a low etch selectivity between the STI structures 204/206 and the fill layer 218, the first STI structures 204 and the second STI structures 206 may also be slightly etched by the etching process 224, as illustrated in FIG. 8.

Figure 9:
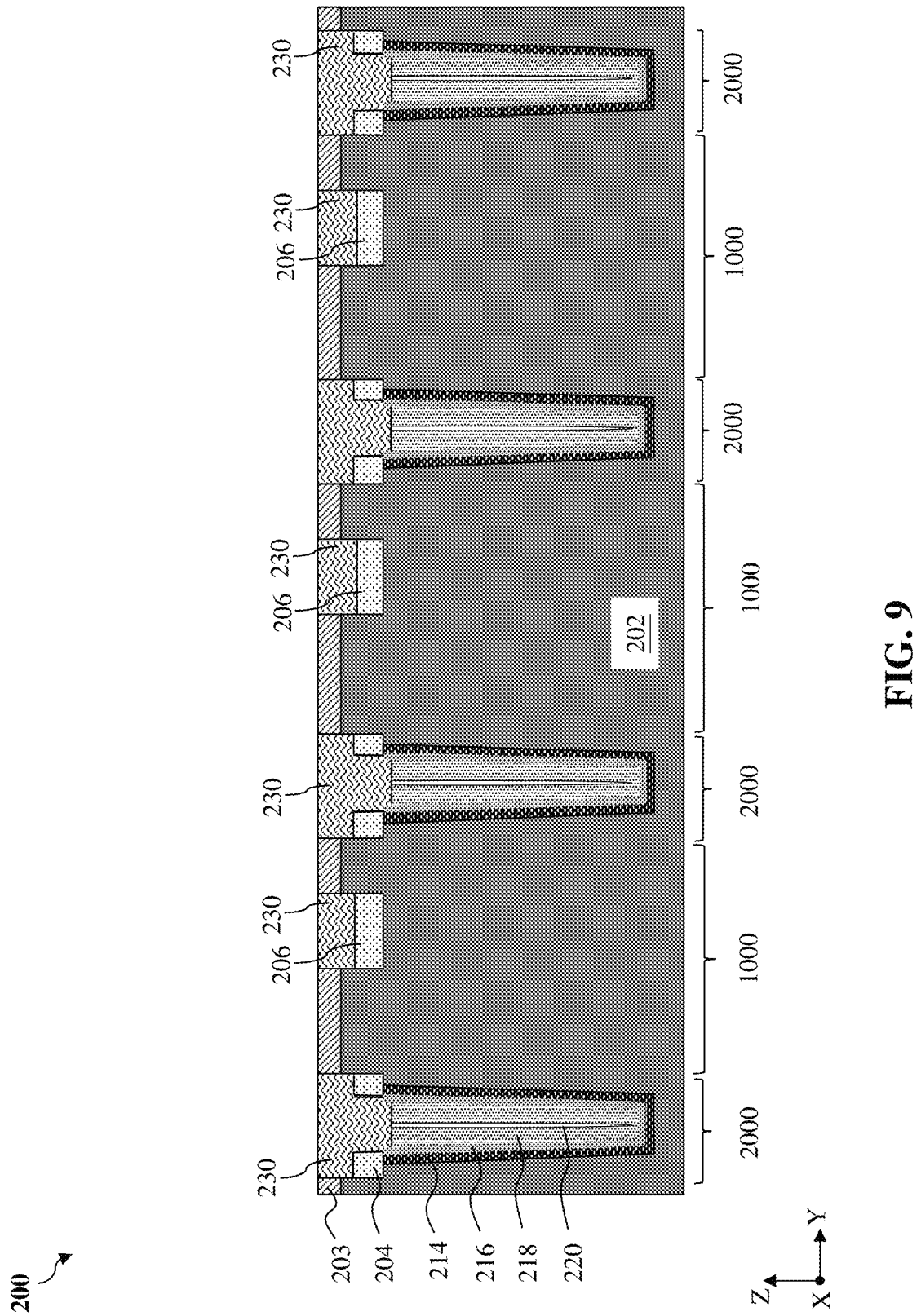

Referring to FIGS. 1 and 9, the method 100 includes a block 114 where a dielectric layer 230 is deposited over the workpiece 200 to refill the second trench 226. The dielectric layer 230 may be referred to as a refill layer 230. After the formation of the second trench 226, a dielectric material is deposited over the workpiece 200 and in the second trench 226 using a suitable method, such as atomic layer deposition (ALD), chemical vapor deposition (CVD), or other suitable method. The dielectric material may include silicon oxide, silicon nitride, silicon oxycarbide, silicon oxycarbonitride, silicon carbonitride, metal nitride, or a suitable dielectric material. In some embodiments, a composition of the dielectric material may be the same as a composition of the first STI structure 204. For example, both the first STI structure 204 and the dielectric material may include silicon oxide. In some embodiments, a composition of the dielectric material may be different than a composition of the first STI structure 204. For example, the first STI structure 204 may include silicon oxide and the dielectric material may include silicon nitride. In embodiments where the first STI structures 204 and the second STI structures 206 were slightly etched back by the etching process 224, the refill layer 230 is also formed on the recessed first STI structures 204 and the second STI structures 206, thus capping the first STI structure 204 and the second STI structures 206, as shown in FIG. 9. Operations at the block 114 may include performing a planarization process to remove excess dielectric material and the planarization process will stop on the protecting layer 203, thereby forming the refill layer 230 in the second trench 226. The planarization process may include a CMP process.

Figure 10:
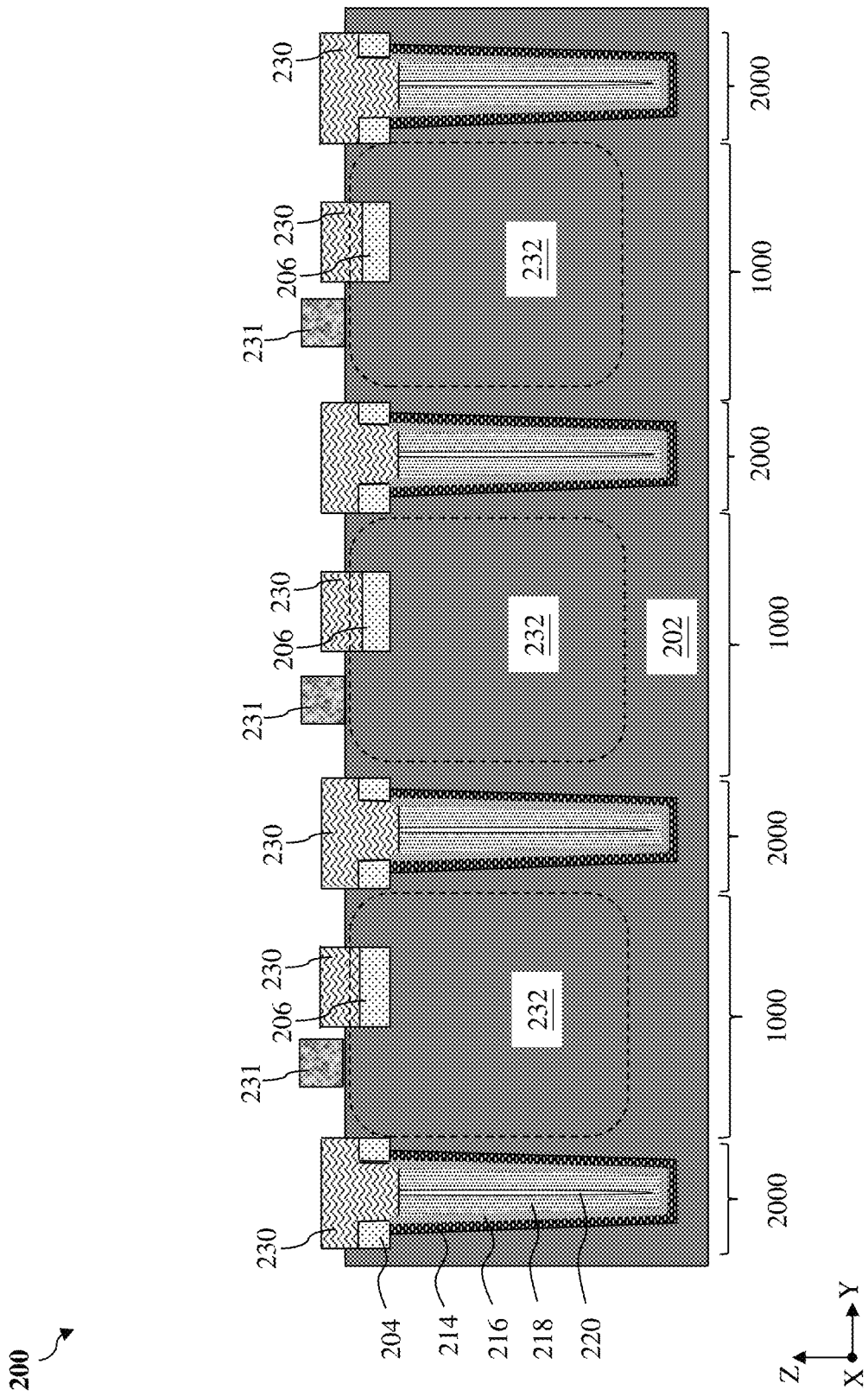

Referring to FIGS. 1 and 10, the method 100 includes a block 116 where a wet etching process is performed to remove the protecting layer 203 and expose the first substrate 202, for example, using a phosphoric acid to corrode the protecting layer 203. In some embodiments, after exposing the first substrate 202, for each pixel region 1000, components such as a photodiode and a number of transistors (e.g., transfer transistor, reset transistor, source follower) may be formed in the pixel region 1000 to form a pixel (represented by dashed rectangles 232 in FIG. 10). In some other implementations, each pixel may include a photodiode, and two or more pixels may share one or more of the number of transistors. Each of the transistors in the pixel may include a gate structure (such as gate structure 231 shown in FIG. 10) formed over the first surface 202a of the first substrate 202 in the pixel region 1000. Although not explicitly shown, the gate structure 231 may include a gate dielectric layer and a gate electrode layer over the gate dielectric layer. It is understood that pixel 232 is for illustration purpose only and is not intended to limit the present disclosure to what is explicitly illustrated therein.

Figure 11:
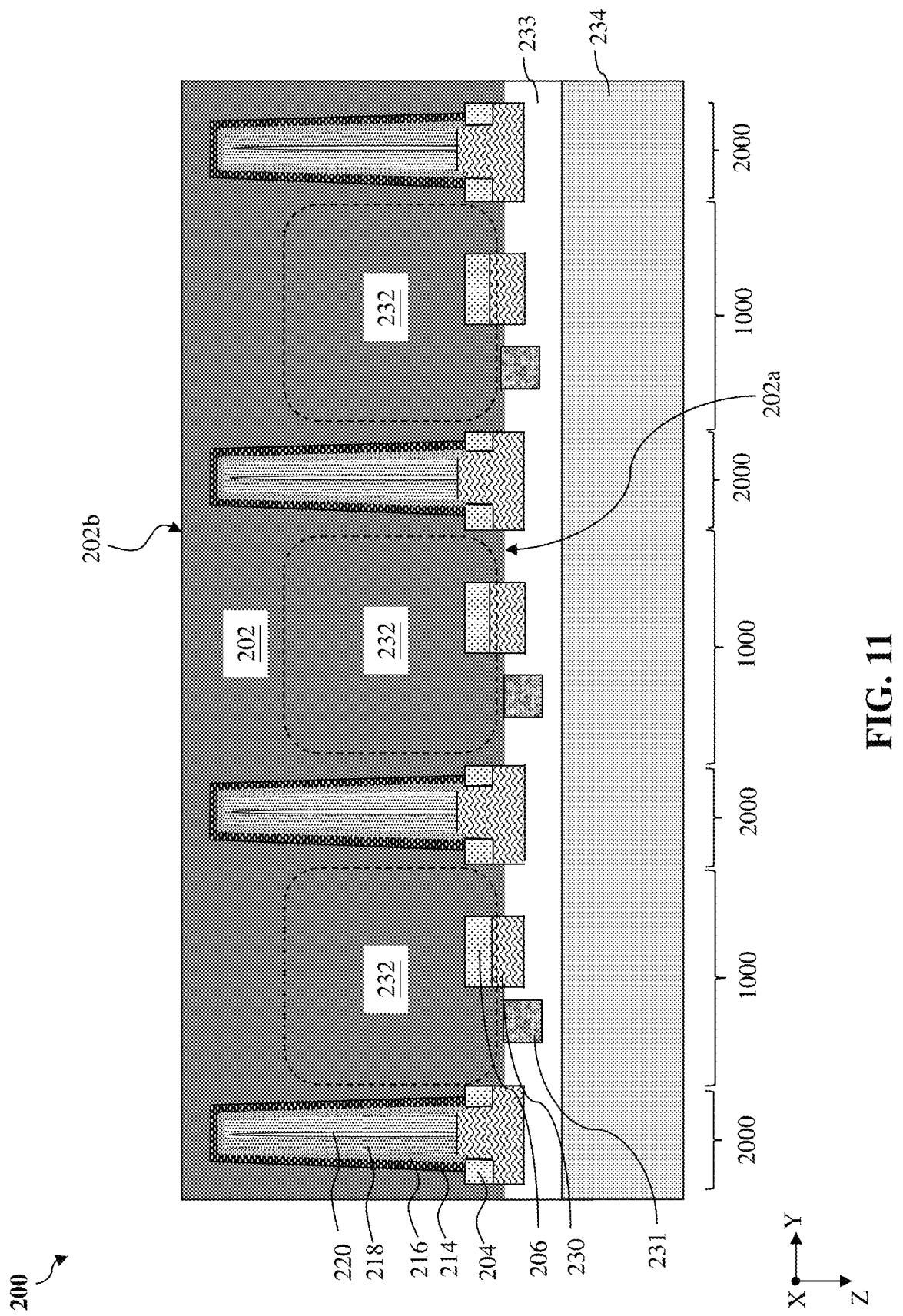

Referring to FIGS. 1 and 11, the method 100 includes a block 118 where an interconnect structure 233 is formed over the workpiece 200. In some embodiments, the interconnect structure 233 may include multiple interlayer dielectric (ILD) layers and multiple metal lines or contact vias in each of the ILD layers (not shown). The metal lines and contact vias in each ILD layer may be formed of metal, such as aluminum, tungsten, ruthenium, or copper. Because the interconnect structure 233 is formed over the front side of the workpiece 200, the interconnect structure 233 may also be referred to as a front-side interconnect structure 233. Subsequently, a second substrate 234 is bonded to or attached to the interconnect structure 233. In some embodiments, the second substrate 234 may be bonded to the interconnect structure 233 by fusion bonding, by the use of an adhesion layer, or a combination thereof. In some instances, the second substrate 234 may be a carrier substrate and may include semiconductor materials (such as silicon), sapphire, glass, polymeric materials, or other suitable materials. In some embodiments, the second substrate 234 may also include multiple interlayer dielectric (ILD) layers and multiple metal lines and contact vias in each of the ILD layers (not shown). The metal lines in each ILD layer may be formed of aluminum, tungsten, ruthenium, cobalt, or copper. In some embodiments, the second substrate 234 may include application specific integrated circuits (ASIC). Once the second substrate 234 is bonded to the interconnect structure 233, the workpiece 200 is flipped over, as shown in FIG. 11, such that the first substrate 202 is on the top and is disposed over the second substrate 234.

Figure 12:
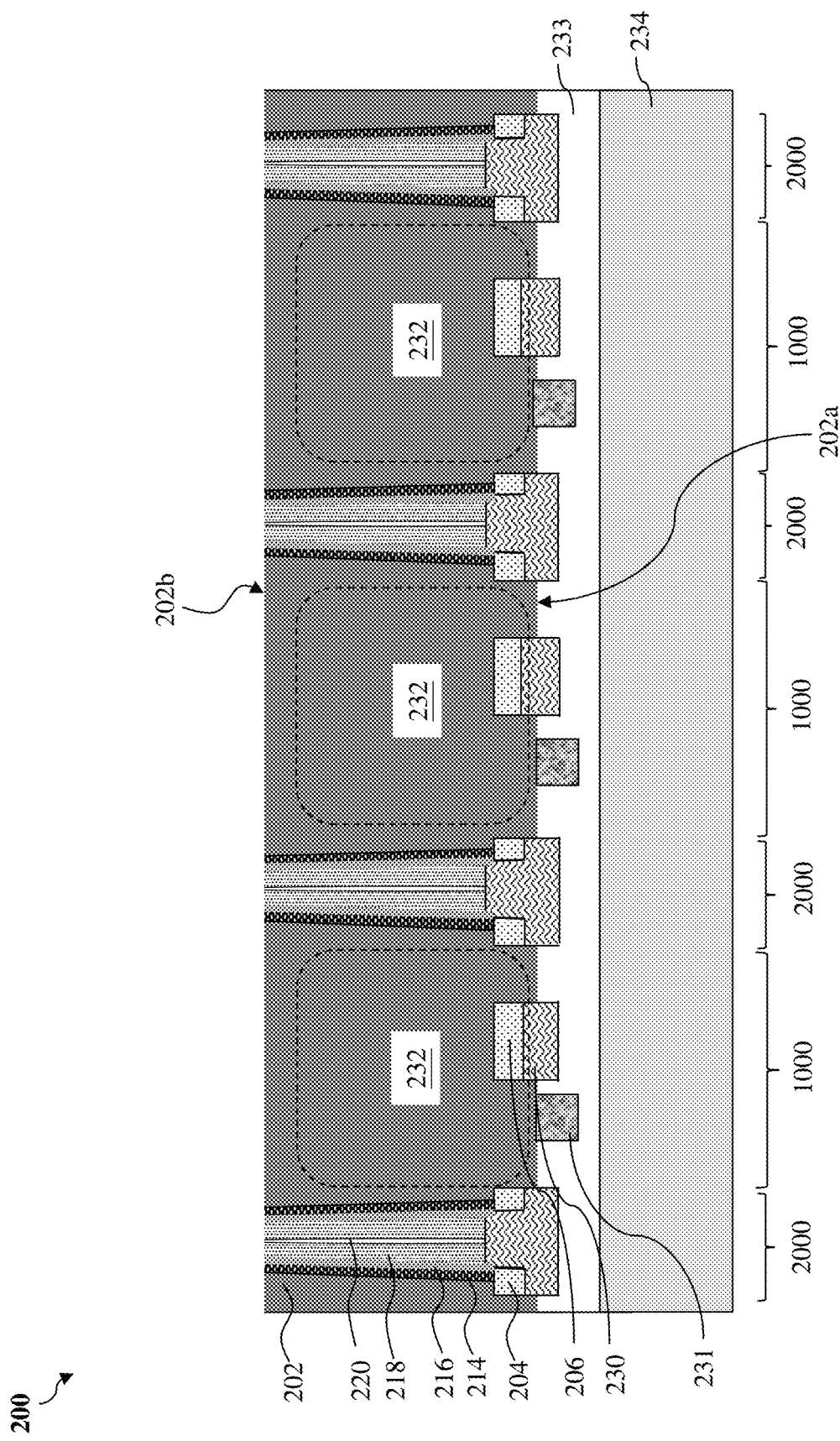

Referring to FIGS. 1 and 12, the method 100 includes a block 120 where the workpiece 200 is thinned down from the second surface 202b until the seams 220 are uncapped or exposed. The thinning process may include a chemical thinning process and/or a mechanical grinding process. A substantial amount of the first substrate 202 may be first removed during a chemical thinning process. In some instances, the chemical thinning process includes a wet etching process with a wet etchant selected from, but not limited to, ammonium hydroxide ($NH_4OH$), tetramethylammonium hydroxide (TMAH), ethylenediamine pyrocatechol (EDP), or potassium hydroxide (KOH) solution. Afterwards, a mechanical grinding process, such as a CMP process, may be applied to remove portions of the first substrate 202, the doped region 214, the dielectric liner 216, and the fill layer 218, such that the seams 220 are exposed from the backside of the substrate 202.

Figure 13:
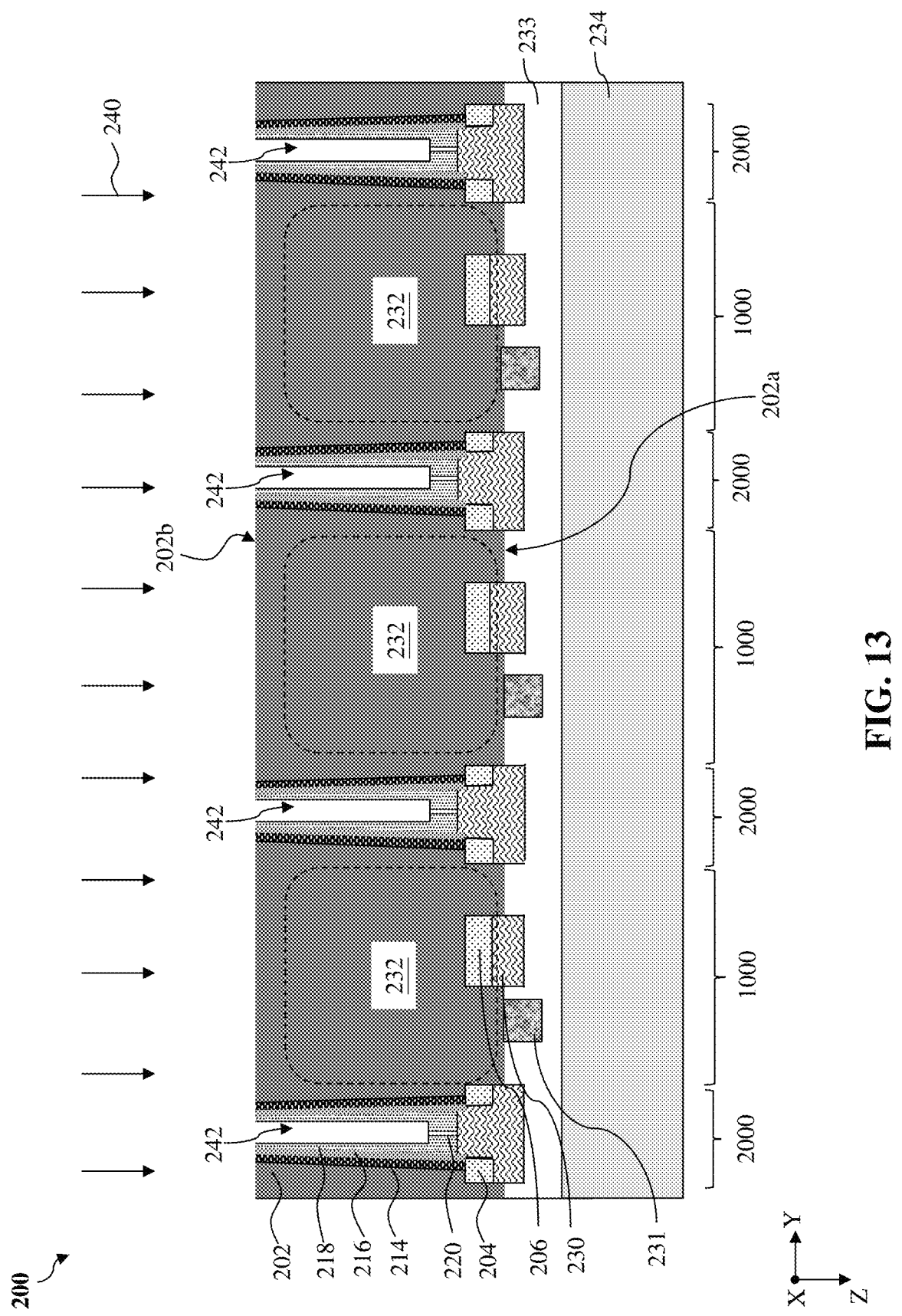

Referring to FIGS. 1 and 13, the method 100 includes a block 122 where an etching process 240 is performed to selectively remove portions of the fill layer 218 without substantially etching the dielectric liner 216 and the first substrate 202. The etching process 240 may be a wet etching process that implements a suitable etchant. In one embodiment, the fill layer 218 includes polysilicon and the etching process 240 is a wet etching process using TMAH as a wet etchant. The wet etchant may propagate along the exposed seams 220 from the uncapped top openings formed in the process of FIG. 12. Accordingly, the wet etchant starts to react with the sidewalls of the fill layer 218 exposed by the exposed seams 220 and expand a width of upper portions of the seams 220 by removing portions of the fill layer 218 from its center. Because the fill layer 218 has a much larger sidewall surface than top surface, etching of the fill layer 218 mainly takes place on the sidewalls thereof. Therefore, the etching process 240 mainly removes center portions of the fill layer 218 (thus reducing its width along the X and Y directions) with only slightly reducing its height (along the Z direction). The expanded upper portions of the seams 220 are denoted as the third trench 242.

Figure 14:
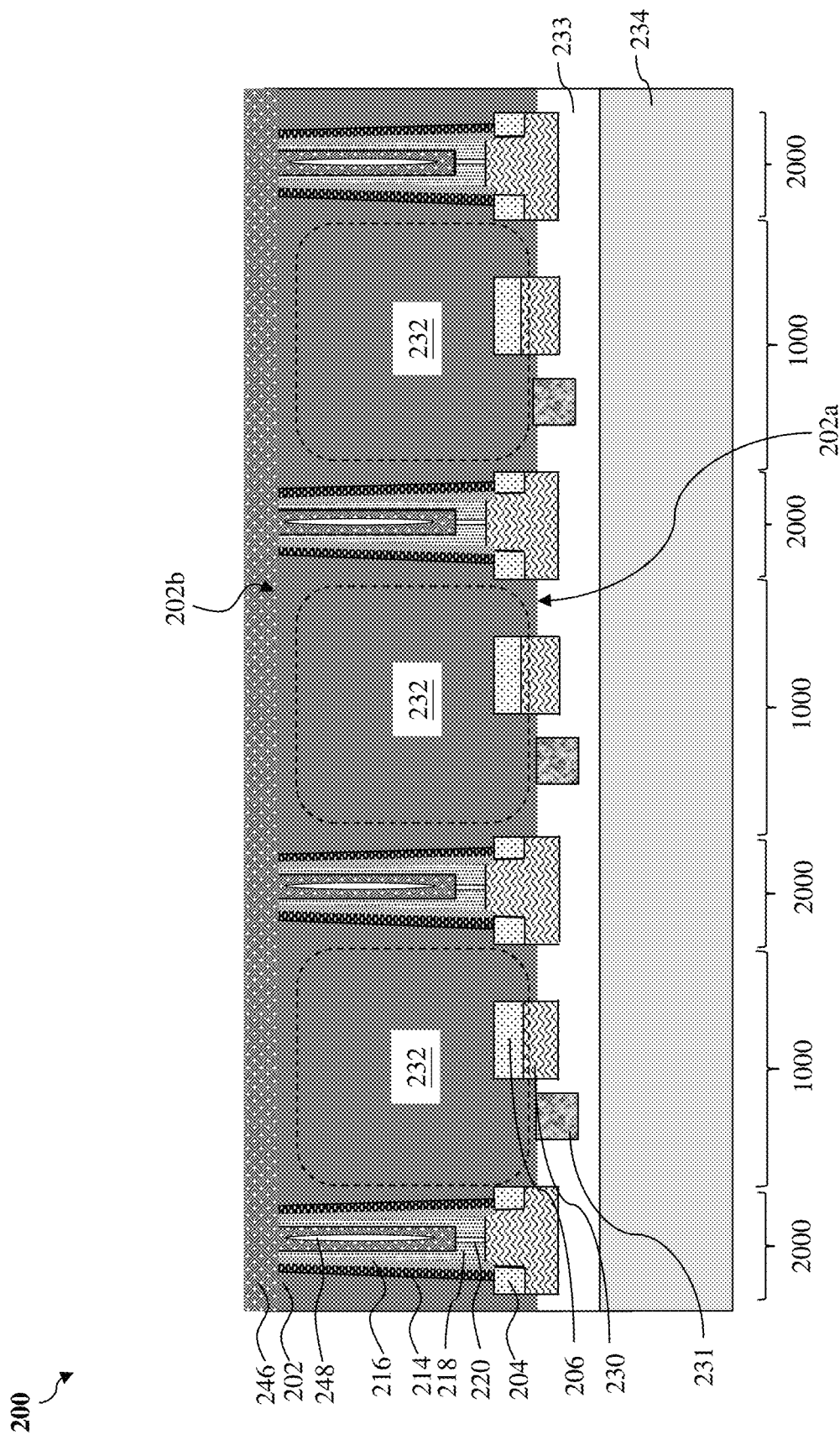
Figure 15:
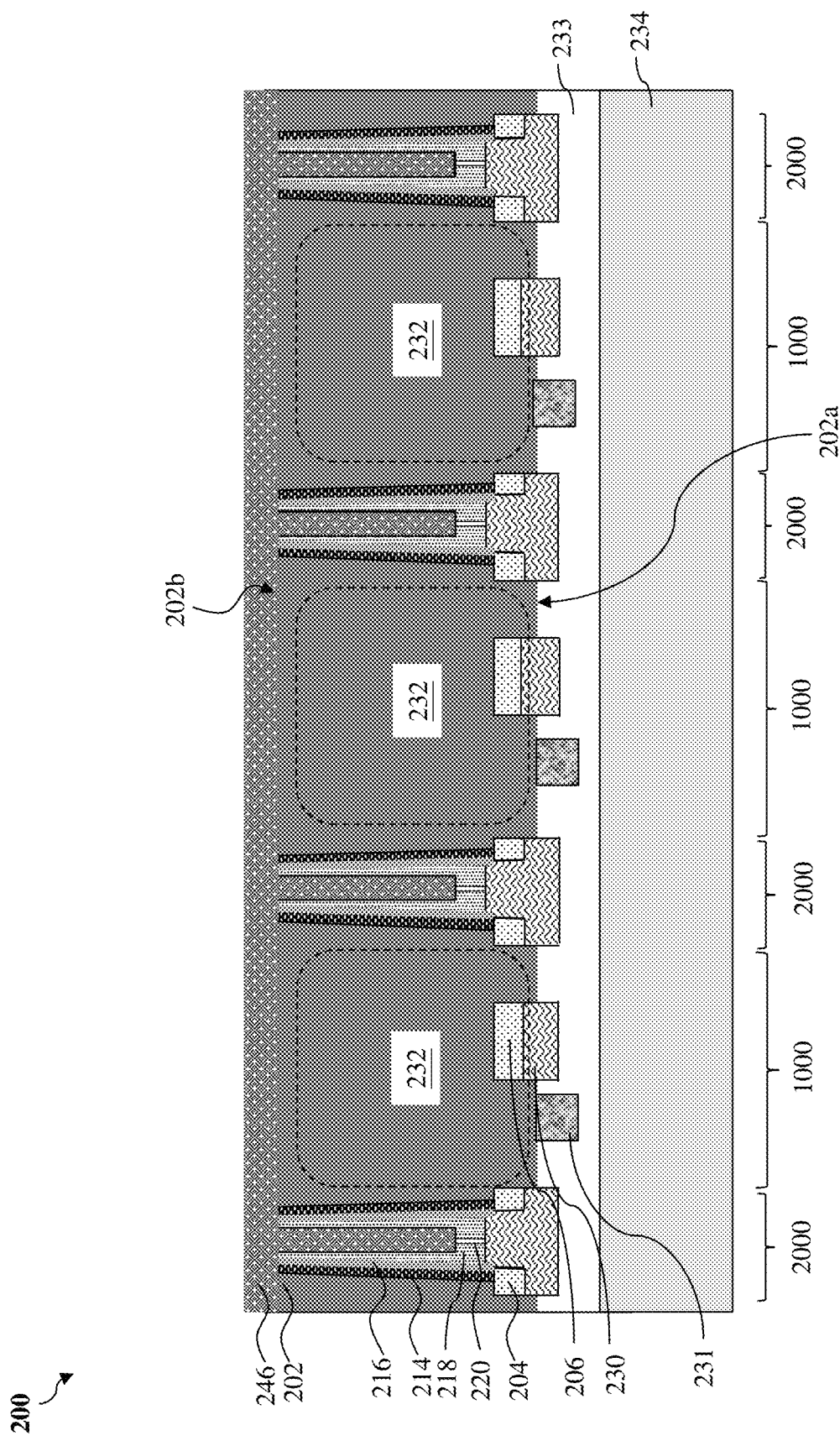

Referring to FIGS. 1 and 14, the method 100 includes a block 124 where a metal layer 246 is formed over the workpiece 200 to substantially fill the third trench 242. In some embodiments, the metal layer 246 includes aluminum, copper, tungsten, or other suitable materials and may be deposited using processes such as CVD, ALD, plating, or other suitable process. In one instance, the metal layer 246 includes aluminum and is deposited by a CVD process using an aluminum-containing precursor, such as trimethylaluminium (TMA), triethylaluminium (TEA), or other suitable chemicals. As the metal layer 246 is deposited on the surfaces of the third trench 242, the width of the third trench 242 becomes smaller, and a seam (air gap) 248 may be formed in the deposited material in some embodiments. To further explain, the high aspect ratio of the relatively narrow space in the third trench 242 and a slightly higher deposition rate at the opening of the third trench 242 than inside the third trench 242 cause the deposited material to close off the opening of the third trench 242 before the inside of the third trench 242 is fully filled, resulting in the seam 248 being sealed by the metal layer 246. The seam 248 extends lengthwise along the Z direction. In the illustrated embodiment, a topmost portion of the seam 248 remains below the second surface 202b. Alternatively, a topmost portion of the seam 248 may extend above the second surface 202b. In another embodiment, the metal layer 246 may fully fill the third trench 242 in a deposition process, such that air gap does not exist in the third trench 242 or is substantially negligible, such as shown in FIG. 15.

Referring to FIGS. 1 and 16, the method 100 includes a block 126 where the backside of the workpiece 200 is planarized to remove excessive metal material over the first substrate 202, thereby exposing the first substrate 202. A combination of the dielectric liner 216, the fill layer 218, the metal layer 246, the first STI structure 204, and the refill layer 230 extends completely through the first substrate 202 and may be collectively referred to as a DTI structure 250. Pixels formed in pixel regions 1000 are optically isolated one from another by the DTI structure 250. The metal layer 246 is surrounded by the fill layer 218 that is surrounded by the dielectric liner 216. The dielectric liner 216 and the filling layer 218 collectively prevent the metal layer 246 from directly contacting the first substrate 202. The dielectric liner 216 and the filling layer 218 may be collectively referred to as a cladding layer 252. The DTI structure 250 also traps the seam 220 and the seam 248 inside in this embodiment. The seam 248 is stacked above the seam 220 in the Z direction. In the illustrated embodiment, the seam 248 is taller and has a larger volume than the seam 220. The high reflectivity of the metal material in the metal layer 246, such as aluminum, ensures an incident light to be fully or substantially fully reflected back to the pixel region 1000. As a result, the quantum efficiency may be increased and the optical cross talk among adjacent pixel regions may be advantageously reduced or substantially eliminated. Therefore, a signal to noise ratio may be increased, and the image integrity may be improved.

Figure 17:
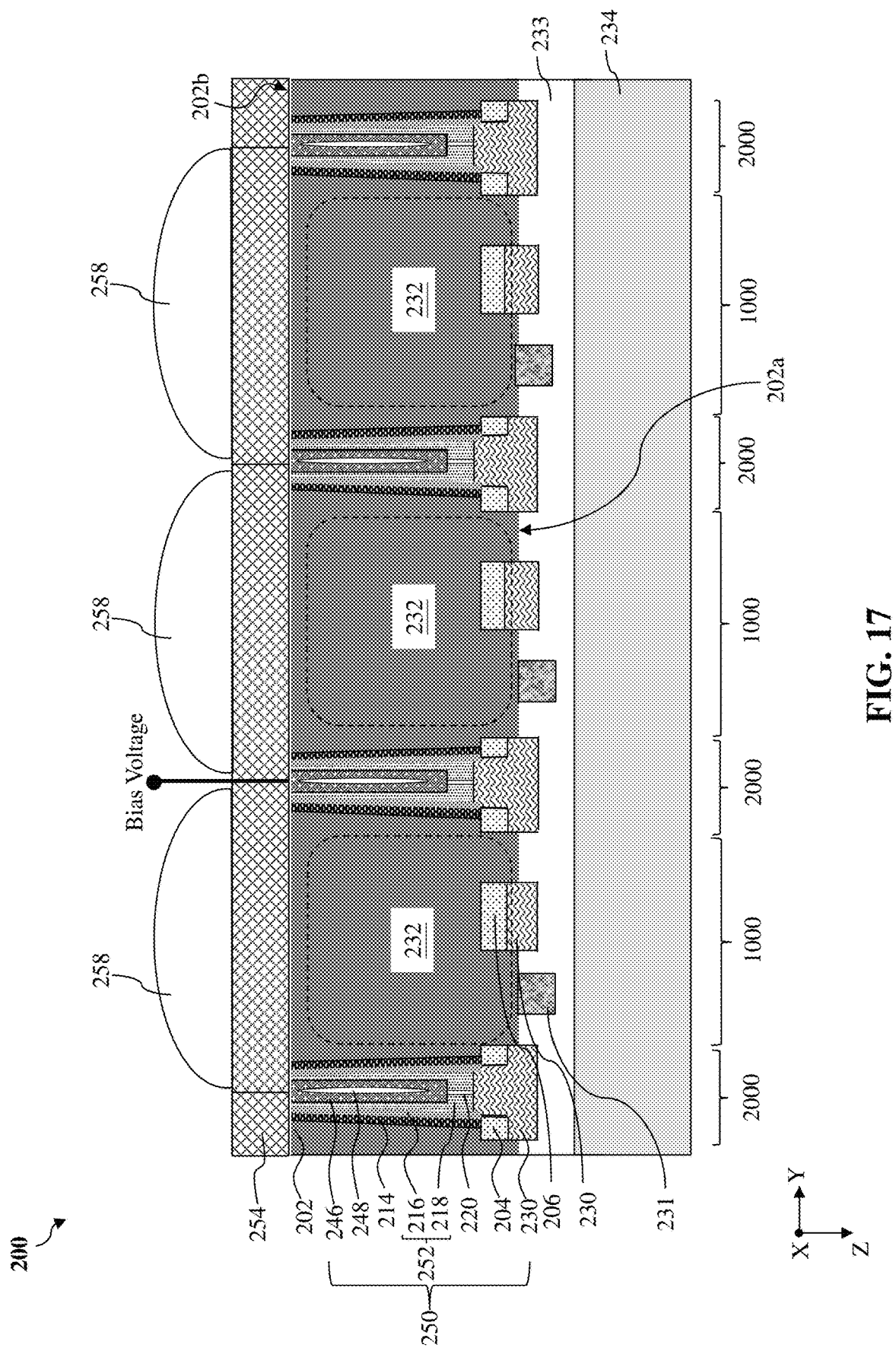

Referring to FIGS. 1 and 17, method 100 includes a block 128 where further processes are performed. Such further process may include forming color filters 254 over the second surface 202b and overlying photodiodes of the workpiece 200 and forming micro lenses 258 over the color filters 254. Other suitable processes may be further performed to finish the fabrication of the semiconductor device 200. For example, a bias voltage 260 may be coupled to the metal layer 246 in the DTI structure 250 through contacts (not shown). In embodiments where the first substrate 202 is a p-type substrate, the bias voltage 260 is a negative voltage, which may be applied to the metal layer 246 and then the conductive filling layer 218 to induce hole accumulation at the sidewall of the DTI structure 250 to isolate the dangling bonds and/or defects at the interface between the first substrate 202 and the DTI structure 250, thereby reducing dark current and white pixels. In embodiments where the first substrate 202 is an n-type substrate, the bias voltage 260 is a positive voltage, which may be applied to the metal layer 246 and then the conductive filling layer 218 to induce electron accumulation at the sidewall of the DTI structure 250.

Figure 18:
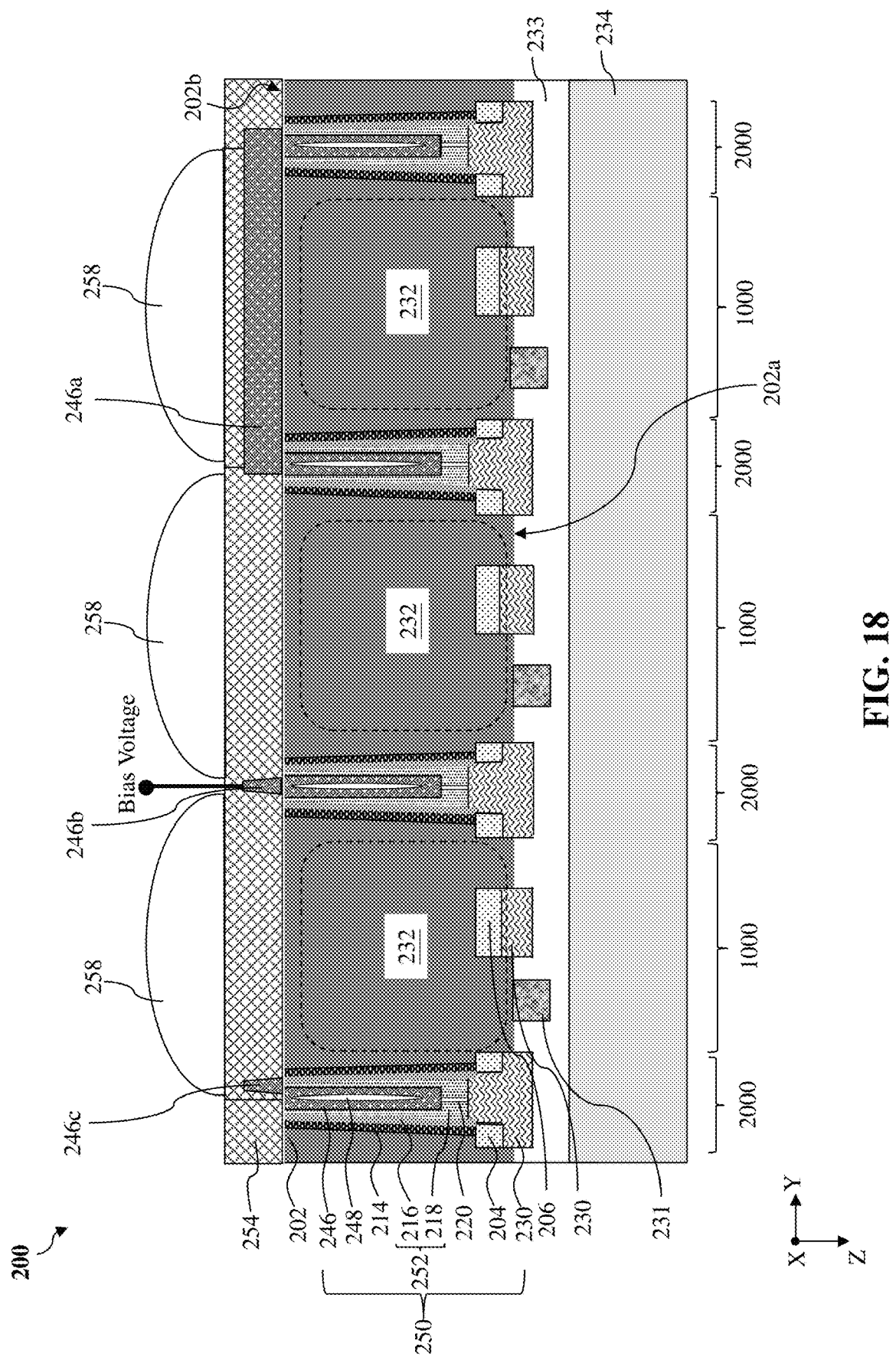

The reference is now made to FIG. 18. In an alternative embodiment, after the conclusion of the block 124 where the metal layer 246 is formed on the second surface 202b of the first substrate 202, the method 100 may optionally pattern the metal layer 246 to form a metal grid overlying the DTI structure 250. The metal grid may include a light shield 246a that fully blocks one or more pixel regions 1000 thereunder from receiving incident light, which allows the respective pixel(s) to represent "true" black, which is useful for a black level correction. The metal grid may also include metal stands 246b and 246c landing on the DTI structure 250. Both the metal stands 246b and 246c effectively extend the DTI structure 250 in the Z direction, partially or fully separating adjacent color filters 254. Thus, the metal stands 246b and 246c help suppress optical cross talk among adjacent color filters 254. In one embodiment, several color filters 254 are placed in the metal grid to form a buried color filter array (BCFA). In some embodiments, the metal stand 246b may also function as a contact (electrode) for a bias voltage 260 to be coupled to the metal layer 246 in the DTI structure 250. In the illustrated embodiment, the metal stand 246b is vertically aligned with the respective metal layer 246 thereunder, while the metal stand 246c is laterally offset from the respective metal layer 246 thereunder, such that the metal stand 246c partially lands on the cladding layer 252. Such an offset is beneficial for an image field distortion correction when the pixel region 1000 under the metal stand 246c is a peripheral cell in the image sensor and the pixel region 1000 under the metal stand 246b is closer to a center in the image sensor.

Although not intended to be limiting, one or more embodiments of the present disclosure provide many benefits to image sensors and an imaging system. For example, by forming the disclosed hybrid DTI structure with a metal layer surrounded by the cladding layer, the optical performance of the DTI structure is enhanced by the metal layer while ensuring that a bias voltage may be applied to the DTI structure. A pixel may be optically isolated from its neighboring pixels. Optical cross talk may be advantageous reduced or even substantially eliminated, and quantum efficiency may be advantageously increased. Further, the disclosed methods can be easily integrated into existing semiconductor manufacturing processes.

The present disclosure provides for many different embodiments. Semiconductor structures and methods of fabrication thereof are disclosed herein. In one exemplary aspect, the present disclosure is directed to a method of forming an image sensor. The method includes receiving a workpiece having a first substrate, etching a frontside of the first substrate, thereby forming a first trench, depositing a fill layer in the first trench, removing a portion of the fill layer from a backside of the first substrate, thereby forming a second trench surrounded by the fill layer, and depositing a metal layer in the second trench, thereby forming an isolation structure comprising the metal layer and the fill layer, where the isolation structure separates adjacent pixel regions of the image sensor. In some embodiments, the depositing of the fill layer includes depositing polysilicon in the first trench and doping the polysilicon. In some embodiments, the depositing of the metal layer includes depositing metal material using a chemical vapor deposition (CVD) process. In some embodiments, the method further includes prior to the removing of the portion of the fill layer, thinning the backside of the first substrate, thereby exposing a seam sealed in the fill layer from the backside of the first substrate, where the seam is formed during the depositing of the fill layer in the first trench. In some embodiments, the removing of the portion of the fill layer includes etching a center portion of the fill layer from the exposed seam using a wet etchant. In some embodiments, the method further includes prior to the depositing of the fill layer, forming a dielectric liner in the first trench, where the dielectric liner separates the fill layer from the first substrate. In some embodiments, the first substrate includes an isolation feature formed in the frontside of the first substrate, where the first trench extends through the isolation feature. In some embodiments, the method further includes prior to the removing of the portion of the fill layer, bonding a second substrate to the frontside of the first substrate. In some embodiments, the depositing of the metal layer in the second trench includes depositing the metal layer in the second trench and on the backside of the first substrate, and planarizing the workpiece, thereby exposing the backside of the first substrate. In some embodiments, the depositing of the metal layer in the second trench includes depositing the metal layer in the second trench and on the backside of the first substrate, and patterning the metal layer, thereby forming a metal grid over the isolation structure.

In another exemplary, the present disclosure is directed to a method of forming an image sensor. The method includes receiving a substrate comprising an isolation structure formed in a frontside of the substrate, forming a first trench extending through the isolation structure and into a portion of the substrate, filling the first trench with a first conductive material; removing a bottom portion of the substrate, thereby exposing the first conductive material from a backside of the substrate, removing a center portion of the first conductive material from the backside of the substrate, thereby forming a second trench, filling the second trench with a second conductive material, and removing a portion of the second conductive material from the backside of the substrate. In some embodiments, the first conductive material comprises doped polysilicon and the second conductive material comprises aluminum. In some embodiments, the method further includes prior to the removing of the bottom portion of the substrate, forming a photodiode in a region of the substrate surrounded by multiple first trenches. In some embodiments, the filling of the first trench with the first conductive material includes forming an air gap sealed in the first conductive material. In some embodiments, the forming of the second trench includes expanding a width of the air gap in a wet etching process. In some embodiments, the removing of the portion of the second conductive material includes patterning the second conductive material to form an electrode, where the electrode is configured to couple a bias voltage to the second conductive material in the second trench.

In yet another exemplary aspect, the present disclosure is directed to an image sensor device. The image sensor device includes a substrate having a frontside surface and a backside surface, a first photosensitive device and a second photosensitive device disposed in the substrate, and an isolation structure extending through the substrate and disposed between the first photosensitive device and the second photosensitive device. The isolation structure includes an upper portion and a lower portion. The upper portion is proximal the frontside surface and the lower portion is proximal the backside surface. The lower portion includes a cladding layer extending vertically from the upper portion to the backside surface, and a metal layer surrounded by the cladding layer and extending to the backside surface. In some embodiments, the cladding layer includes a dielectric liner and a doped poly silicon layer surrounded by the dielectric liner. In some embodiments, the image sensor device further includes an air gap surrounded by the cladding layer and extending vertically from the upper portion to the metal layer. In some embodiments, the metal layer is coupled to a bias voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor, comprising:
receiving a workpiece having a first substrate;
etching a frontside of the first substrate, thereby forming a first trench;
depositing a fill layer in the first trench;
removing a portion of the fill layer from a backside of the first substrate, thereby forming a second trench surrounded by the fill layer; and
depositing a metal layer in the second trench, thereby forming an isolation structure comprising the metal layer and the fill layer, wherein the isolation structure separates adjacent pixel regions of the image sensor.

2. The method of claim 1, wherein the depositing of the fill layer comprises:
depositing polysilicon in the first trench; and
doping the polysilicon.

3. The method of claim 1, wherein the depositing of the metal layer comprises depositing metal material using a chemical vapor deposition (CVD) process.

4. The method of claim 1, further comprising:
prior to the removing of the portion of the fill layer, thinning the backside of the first substrate, thereby exposing a seam sealed in the fill layer from the backside of the first substrate, wherein the seam is formed during the depositing of the fill layer in the first trench.

5. The method of claim 4, wherein the removing of the portion of the fill layer comprises etching a center portion of the fill layer from the exposed seam using a wet etchant.

6. The method of claim 1, further comprising:
prior to the depositing of the fill layer, forming a dielectric liner in the first trench, wherein the dielectric liner separates the fill layer from the first substrate.

7. The method of claim 1, wherein the first substrate comprises an isolation feature formed in the frontside of the first substrate, and wherein the first trench extends through the isolation feature.

8. The method of claim 1, further comprising:
prior to the removing of the portion of the fill layer, bonding a second substrate to the frontside of the first substrate.

9. The method of claim 1, wherein the depositing of the metal layer in the second trench comprises:

depositing the metal layer in the second trench and on the backside of the first substrate; and planarizing the workpiece, thereby exposing the backside of the first substrate.

10. The method of claim 1, wherein the depositing of the metal layer in the second trench comprises:

depositing the metal layer in the second trench and on the backside of the first substrate; and patterning the metal layer, thereby forming a metal grid over the isolation structure.

11. A method of forming an image sensor, comprising:

receiving a substrate comprising an isolation structure formed in a frontside of the substrate;

forming a first trench extending through the isolation structure and into a portion of the substrate;

filling the first trench with a first conductive material;

removing a bottom portion of the substrate, thereby exposing the first conductive material from a backside of the substrate;

removing a center portion of the first conductive material from the backside of the substrate, thereby forming a second trench;

filling the second trench with a second conductive material; and removing a portion of the second conductive material from the backside of the substrate.

12. The method of claim 11, wherein the first conductive material comprises doped polysilicon and the second conductive material comprises aluminum.

13. The method of claim 11, further comprising:

prior to the removing of the bottom portion of the substrate, forming a photodiode in a region of the substrate surrounded by multiple first trenches.

14. The method of claim 11, wherein the filling of the first trench with the first conductive material comprises forming an air gap sealed in the first conductive material.

15. The method of claim 14, wherein the forming of the second trench comprises expanding a width of the air gap in a wet etching process.

16. The method of claim 11, wherein the removing of the portion of the second conductive material comprises patterning the second conductive material to form an electrode, wherein the electrode is configured to couple a bias voltage to the second conductive material in the second trench.

17. A method of forming an image sensor, comprising:

receiving a substrate;

forming a first trench extending into a top portion of the substrate;

filling the first trench with a first conductive material;

forming a photodiode in a region of the substrate adjacent the first trench;

after the forming of the photodiode, thinning a bottom portion of the substrate, thereby exposing a bottom portion of the first conductive material;

partially recessing the bottom portion of the first conductive material to form a second trench;

filling the second trench with a second conductive material; and forming a color filter overlying the photodiode.

18. The method of claim 17, wherein the first conductive material comprises doped polysilicon and the second conductive material comprises a metal.

19. The method of claim 17, wherein the filling of the second trench with the second conductive material includes capping a first airgap in the first conductive material and trapping a second airgap in the second trench.

20. The method of claim 17, wherein the color filter is in physical contact with the first conductive material and the second conductive material.

* * * * *